(12) United States Patent
Malvar

(10) Patent No.: US 7,580,585 B2
(45) Date of Patent: *Aug. 25, 2009

(54) LOSSLESS ADAPTIVE GOLOMB/RICE ENCODING AND DECODING OF INTEGER DATA USING BACKWARD-ADAPTIVE RULES

(75) Inventor: Henrique S. Malvar, Sammamish, WA (US)

(73) Assignee: Microsoft Corporation, Redmond, WA (US)

(*) Notice: Subject to any disclaimer, the term of this patent is extended or adjusted under 35 U.S.C. 154(b) by 689 days.

This patent is subject to a terminal disclaimer.

(21) Appl. No.: 10/977,701

(22) Filed: Oct. 29, 2004

(65) Prior Publication Data

US 2006/0103556 A1 May 18, 2006

(51) Int. Cl.
*G06K 9/46* (2006.01)
*G06K 9/36* (2006.01)
*G06K 9/48* (2006.01)
*H03M 7/00* (2006.01)
*H03M 7/12* (2006.01)
*H03M 7/46* (2006.01)
*H03M 7/40* (2006.01)
*H04N 7/12* (2006.01)

(52) U.S. Cl. .................. 382/245; 382/232; 382/239; 382/246; 341/59; 341/63; 341/65; 341/67; 375/240.02; 375/240.07; 375/240.12; 375/240.23; 375/240.24

(58) Field of Classification Search ............... 382/232, 382/239, 244, 245, 246; 341/51, 59, 63, 341/65, 67; 375/240.02, 240.07, 240.23, 375/240.12

See application file for complete search history.

(56) References Cited

U.S. PATENT DOCUMENTS

| 5,764,374 | A  | * | 6/1998  | Seroussi et al. | ............ 382/244 |
| 6,477,280 | B1 | * | 11/2002 | Malvar          | ............ 382/245 |
| 6,549,676 | B1 | * | 4/2003  | Nakayama et al. | ............ 382/246 |
| 6,650,784 | B2 | * | 11/2003 | Thyagarajan     | ............ 382/244 |

(Continued)

OTHER PUBLICATIONS

Merhav, Neri, Gadiel Seroussi, and Marcel J. Weinberger. "Optimal Prefix Codes for Sources with Two-Sided Geometric Distributions." IEEE Transactions on Information Theory 46(2000): 121-135.*

(Continued)

*Primary Examiner*—Matthew C Bella
*Assistant Examiner*—Michael A Newman
(74) *Attorney, Agent, or Firm*—Lyon & Harr, L.L.P.; Craig S. Fischer

(57) ABSTRACT

A method and system of lossless adaptive Golomb/Rice (G/R) encoding of integer data using a novel backward-adaptive technique having novel adaptation rules. The adaptive G/R encoder and decoder (codec) and method uses adaptation rules that adjust the G/R parameter after each codeword is generated. These adaptation rules include defining an adaptation value and adjusting the G/R parameter based on the adaptation value. If the adaptation value equals zero, then the G/R parameter is decreased by an integer constant. If the adaptation value equals one, then the G/R parameter is left unchanged. If the adaptation value is greater than one, then the G/R parameter is increased by the adaptation value. In addition, the adaptive G/R encoder and method include fractional adaptation, which defines a scaled G/R parameter in terms of the G/R parameter and updates and adapts the scaled G/R parameter to slow down the rate of adaptation.

28 Claims, 9 Drawing Sheets

U.S. PATENT DOCUMENTS

| | | | |
|---|---|---|---|
| 6,771,828 B1 | 8/2004 | Malvar | |
| 6,909,811 B1* | 6/2005 | Kajiwara et al. | 382/246 |
| 6,987,468 B1* | 1/2006 | Malvar | 341/59 |
| 7,015,837 B1* | 3/2006 | Malvar | 341/59 |
| 2004/0184545 A1 | 9/2004 | Thyagarajan | |

OTHER PUBLICATIONS

Costa, M.H.M, and H. S. Malvar, Efficient run-length encoding of binary sources with unknown statistics, Technical Report MSR-TR-2003-95, Microsoft Research, Dec. 19, 2003.

Weinberger, M., G. Seroussi, and G. Sapiro, LOCO-1: a low complexity, context-based, lossless image compression algorithm, *Data Compression Conference (DCC '96)*, pp. 140-149.

Malvar, H. S., Fast progressive wavelet coding, *Data Compression Conference (DCC '99)*, pp. 336-343.

Memon, N., Adaptive coding of DCT coefficients by Golomb-Rice codes, *Proceedings Int'l. Conf. on Image Processing*, 1998, vol. 1, pp. 516-520.

European Search Report, Application No. 5109583.4, completed Jan. 23, 2006, received Feb. 6, 2006.

European Search Report, Application No. 5109484.5, completed Mar. 8, 2006, received Mar. 28, 2006.

Co-pending U.S. Patent Application, "Lossless Adaptive Encoding and Decoding of Integer Data", filed Oct. 29, 2004.

Co-pending U.S. Patent Application, "Lossless Adaptive Encoding and Decoding of Integer Data", filed Oct. 29, 2004.

Langdon, Jr., G. G., "An adaptive run-length encoding algorithm," *IBM Tech. Disclosure Bulletin*, vol. 26, pp. 3783-3785, Dec. 1983.

Merhav, N., Seroussi, G. and Weinberger, M. J., "Optimal prefix codes for sources with two-sided geometric distributions," *IEEE Trans. Inform. Theory*, vol. 46, No. 1, pp. 121-135, Jan. 2000.

Ordentlich, E., Weinberger, M. and Seroussi, G., "A low-complexity modeling approach for embedded coding of wavelet coefficients," *Proc. Data Compression Conference*, Snowbird, Utah, pp. 408-417, Mar. 1998.

Weinberger, M. J., Seroussi, G. And Sapiro, G., "The LOCO-I lossless image compression algorithm: principles and standardization into JPEG-LS," *IEEE Trans. Image Processing*, vol. 9, pp. 1309-1324, Aug. 2000.

\* cited by examiner

LOSSLESS ADAPTIVE GOLOMB/RICE ENCODING AND DECODING OF INTEGER DATA USING BACKWARD-ADAPTIVE RULES

TECHNICAL FIELD

The present invention relates in general to the processing of digital data and more particularly to an improved method and system of lossless encoding and decoding of integer data using Golomb/Rice encoding having novel backward-adaptive rules.

BACKGROUND OF THE INVENTION

Data compression is becoming increasingly important as the size of computer data (such as text, audio, video, image and program files) continues to grow. Data compression is a way of encoding digital data into an encoded representation that uses fewer bits than the original data. Representing the data in fewer bits means that the data occupies less storage space and requires less transmission bandwidth.

In general, data compression compresses a data by predicting the most frequently-occurring data and storing it in less space. Specifically, data compression involves at least two different tasks: (1) defining a data model to predict the probabilities of the input data; and (2) using a coder to generate codes from those probabilities. In addition, some data compression techniques mathematically transform and quantize the data to achieve even greater compression.

A compression technique may be lossless or lossy. A lossless compression technique is reversible such that the original data before encoding and the decompressed data after decoding are bit-for-bit identical. Lossy compression uses the fact there is much repetition in data that can be thrown away with much loss in quality. Lossy compression accepts the loss of some of the original data in order to achieve a higher compression.

Lossless compression typically is used to compress text or binary data, while lossy compression typically is used for audio, image and video data. However, even lossy compression techniques can sometimes use a lossless compression technique. For example, two commonly-used kinds of compression (or coding) technique are transform coding and predictive coding. For such kinds of compression systems, the original data is transformed and then quantized (rounded to nearest integers), or predicted based on (fixed or adaptive) signal models, and the prediction errors (differences between the original and predicted data) are then quantized. In both, cases, the data after quantization are in integer form. Once these integers are obtained, a lossless compression technique is used to encode the quantized values, in order to reduce the number of bits needed to represent the data.

The set of these integer values usually has an associated probability distribution function (PDF). These PDFs have a distribution such that if the data properties are well modeled by the predictor, in predictive coding, then the prediction error should be close to zero most of the time. Similarly, in transform coding, most of the quantized transform coefficients are zero. FIG. 1 illustrates a typical probability distribution for these integer values; zero is the most likely value, and the probabilities of nonzero values decrease nearly exponentially fast as the magnitude increases. The data has a probability distribution shown in FIG. 1 because the data that is being encoded using the lossless compression technique is not the original data. FIG. 1 is the integer data resulting from quantizing transform coefficients or prediction errors.

Mathematically, the problem is to find an efficient solution to encoding a vector x containing N integers. Each of the elements x(n), n=0, 1, ..., N−1, has a value according to a probability distribution similar to that in FIG. 1, so that the most probable value is zero, and values farther away from zero have fast decreasing probabilities.

A simple mathematical model for probability distributions like the one in FIG. 1 is the Laplacian, or two-sided geometric (TSG) distribution, characterized by a parameter θ:

$$P(x, \theta) = \frac{1-\theta}{1+\theta}\theta^{|x|} \quad (1)$$

Note that the parameter θ controls the rate of decay in probability as |x| grows. The larger the value of θ, the faster the decay. The parameter θ can be directly related to the probability that x=0, that is P(0,θ)=(1−θ)/(1+θ). Also, the expected magnitude of the source symbol is:

$$E[|x|] = \frac{2\theta}{1-\theta^2} \quad (2)$$

The entropy of the source is given in bits/symbol by $$H(x) = \log_2\left(\frac{1+\theta}{1-\theta}\right) - \frac{2\theta}{1-\theta^2}\log_2(\theta) \quad (3)$$

Thus, a good encoder should map a vector of N values of x into a bitstream containing not much more than N·H(x) bits, the theoretical minimum.

The Laplacian distribution is a common model in media compression systems, for either prediction errors in predictive coders (like most lossless audio and image coders) or for quantized transform coefficients (like most lossy audio, image, and video coders).

There have been many proposed encoders for sources with a Laplacian/TSG distribution. A simple but efficient encoder is the Golomb-Rice encoder. First, the TSG source values x are mapped to nonnegative values u by the simple invertible mapping:

$$u = Q(x) = \begin{cases} 2x, & x \geq 0 \\ -2x-1 & x < 0 \end{cases} \quad (4)$$

that is equivalent to seeing u as the index to the reordered alphabet {0, −1, +1, −2, +2, ... }. The new source u has a probability distribution that approximates that of a geometric source, for which Golomb codes are optimal, because they are Huffman codes for geometric sources, as long as the Golomb parameter is chosen appropriately.

An example of Golomb-Rice (G/R) codes is shown in Table 1 for several values of the parameter m. It should be noted that when m equals a power of two, a parameter k is used, which is related to m by $m=2^k$. The main advantage of G/R codes over Huffman codes is that the binary codeword can be computed by a simple rule, for any input value. Thus, no tables need to be stored. This is particularly useful for modern processors, for which reading from a memory location that stores a table entry can take longer than executing several instructions. It is easy to see that the parameter m determines how many consecutive codeword have the same number of bits. That also indicates that computing the codeword involves computing u/m, where u is the input value. For most processors, an integer division takes many cycles, so the G/R code for general m is not attractive. When $m=2^k$ is chosen, which corresponds to a Rice then the division u/m can be replaced by a shift, because u/m=u>>k (where >> denotes a right shift operator). Thus, computing the G/R code for any input u is easy; simply compute p=u>>k and v=u−(p<<k). The code is then formed by concatenating a string with p 1's with the k-bit binary representation of v.

when a boundary is reached, such as a pixel value goes from a background value to a foreground value. Every now and then big numbers can occur. When this happens, one type of encoding technique that is more useful than Run-Length encoding is known as a "Run-Length Golomb/Rice (RLGR)" encoding technique. One such RLFT encoding technique is disclosed in U.S. Pat. No. 6,771,828 to Malvar entitled "System and Method for Progressively Transform Coding Digital Data" and U.S. Pat. No. 6,477,280 to Malvar entitled "Lossless Adaptive Encoding of Finite Alphabet Data".

In reality, with the source of data varying, the probabilities will not stay constant and will vary over time. This is true

TABLE 1

| Input value | m = 1<br>k = 0 | m = 2<br>k = 1 | m = 3 | m = 4<br>k = 2 | m = 5 | ... | m = 8<br>k = 3 |
|---|---|---|---|---|---|---|---|
| 0  | 0              | 00       | 00      | 000    | 000    | | 0000  |
| 1  | 10             | 01       | 010     | 001    | 001    | | 0001  |
| 2  | 110            | 100      | 011     | 010    | 010    | | 0010  |
| 3  | 1110           | 101      | 100     | 011    | 0110   | | 0011  |
| 4  | 11110          | 1100     | 1010    | 1000   | 0111   | | 0100  |
| 5  | 111110         | 1101     | 1011    | 1001   | 1000   | | 0101  |
| 6  | 1111110        | 11100    | 1100    | 1010   | 1001   | | 0110  |
| 7  | 11111110       | 11101    | 11010   | 1011   | 1010   | | 0111  |
| 8  | 111111110      | 111100   | 11011   | 11000  | 10110  | | 10000 |
| 9  | 1111111110     | 111101   | 11100   | 11001  | 10111  | | 10001 |
| 10 | 11111111110    | 1111100  | 111010  | 11010  | 11000  | | 10010 |
| 11 | 111111111110   | 1111101  | 111011  | 11011  | 11001  | | 10011 |
| 12 | 1111111111110  | 11111100 | 111100  | 111000 | 11010  | | 10100 |
| 13 | 11111111111110 | 11111101 | 1111010 | 111001 | 110110 | | 10101 |
| .  | .              | .        | .       | .      | .      | | .     |
| .  | .              | .        | .       | .      | .      | | .     |
| .  | .              | .        | .       | .      | .      | | .     |

It is clear from Table 1 that the choice of the G/R parameter k must depend on the statistics of the source. The slower the decay of probability as u increases, the larger k should be chosen. Otherwise, the codeword lengths grow too quickly. A simple rule for choosing k is that the codeword length for a given input value u should approximate the logarithm base 2 of the probability of occurrence of that value.

Although G/R codes are optimal for geometrically-distributed sources, they are not optimal for encoding symbols from a Laplacian/TSG source via the mapping in Equation 4. This is because for an input variable x with a TSG distribution, the variable u from Equation 4 has a probability distribution that is close to but not exactly geometric. In practice, the performance is close enough to optimal (e.g. with a rate that is typically less than 5% above the entropy), so G/R codes are quite popular. The optimal codes for TSG sources involve a set of four code variants, which are more complex to implement and improve compression by 5% or less in most cases. Therefore, in most cases G/R coders provide the best tradeoff between performance and simplicity.

In FIG. 1, the probability distribution is represented by a single parameter, which is the rate of decay of the exponential. The faster the rate of decay, then the more likely is the value of zero. This means that in many cases zero is so likely that runs of zeros become very likely. In other words, if the probability distribution rate of decay is fast enough then encoding runs is a good idea. Encoding runs of zeros means that just a few bits are used to take care of many entries in the input data.

Prediction errors are much more likely to be zero if the data matches the model used by the predictor in predictive coding, for example. It is possible, however, even with a good model, to every once in a while have a large value. This can occur with, for example, images and audio. Typically, these probability variations in the input data are handled in a variety of different ways. In JPEG, for example there is an entropy coder (a Huffman coder) whereby codewords of different lengths are used for different values to be encoded. The Huffman table is usually pre-designed, that is, typically a number of images are obtained, their probabilities are measured, and an average model is constructed that is used for all images. One problem with this approach is that with every portion of an image there is a loss in encoding efficiency, because the probability model being used by the entropy coder is good on average but not necessarily good for that portion of the image.

From Table 1 it can be seen that there are two main issues with Golomb/Rice codes: (1) the probability decay parameter θ, or equivalent the probability P(x=0) must be known, so the appropriate value of k can be determined; and (2) if the decay parameter is too small, the entropy H(x) is less than 1, and thus the Golomb/Rice code is suboptimal, since its average codeword length cannot be less than 1 bit/symbol.

In practice, the first issue (estimation of the optimal Golomb/Rice parameter) is usually addressed by dividing the input vector into blocks of a predetermined length. For each block, the encoder makes two passes over the data. In the first pass, the average magnitude of input values is computed. For that, the parameter θ can be estimated from Equation 2, and the corresponding optimal k can be determined. In a second pass, the encoder generates the bitstream for the block by first outputting the value of k in binary form, followed by the concatenated strings of Golomb/Rice codes for the data values within the block. This is the approach used in essentially all lossless compression systems that use Golomb/Rice codes, such as JPEG-LS for lossless image compression, SHORTEN for lossless audio compression, and others. This is called a "blockwise adaptation" or "forward adaptation" model. The forward adaptation model is forward in the sense that the encoder looks at the data first before encoding, measures a statistical parameter (usually the average magnitude), and then encodes based on that parameter and puts the value of the parameter used to encode the data in a header, for use by the decoder. Instead of trying to code the data all at once, the data is broken up into small portions, or blocks. For each block, the statistics of that block are measured, a statistical parameter is measure for that portion of data that matches what is in the buffer, and the entropy coder is adjusted to that parameter. In the encoded file a header is inserted that indicates the value of the parameter being used to encode that block of data.

The second issue in practice, namely, encoding sources with very low entropy, is usually addressed using a blockwise adaptation or forward adaptation model, and if the average magnitude value of the input symbols in the block is small enough that the estimated entropy H(x) is less than 1, then the encoder uses Run-Length coding, instead of Golomb/Rice coding.

Although these approaches work well in practice, they have two main disadvantages. One disadvantage is that the encoder needs to read each input block twice, such that two passes are performed on the data: a first time to compute the average magnitude to determine the Golomb/Rice parameter, and a second time to perform the actual encoding. This requires the encoder to perform additional work and adds complexity. In some applications encoding time is not an issue, but for digital cameras, for example, it can slow down the encoding process or increase the cost of random-access memory. In particular, the forward adaptation model must first look at the data and measure the statistics, find model parameters, and then encode. This is not an issue if the encoder runs on a personal computer having a great deal of processing power. However, if pictures taken with a cell phone, they are being encoded by the cell phone itself, where processing power is much more limited.

The second and most important disadvantage involves the difficulty in choosing the block size. If the block size is too large, the statistics could change dramatically within the block. On the other hand, if the block size is too small, then the overhead of having to tell the decoder which parameter was used to encode that block of data becomes burdensome. For every block, the encoder must store what parameters values are being used to encode that block. At some point the overhead required to encode the small block is not worth the compression achieved. This is creates a trade-off. On the one hand, if a small block is used, the statistics of the block can be matched, however, measuring the statistics is difficult because there are few numbers, and the overhead of encoding is great. On the other hand, if a large block is used, the problem is that the statistics can vary greatly within the block. In practice, it is hard to find a compromise between those two conflicting factors, so that the block size is usually chosen to be between 128 and 2,048 samples, depending on the type of data to be encoded.

One solution is to use a backward-adaptive technique in the encoder. With backward adaptation, encoding starts with the decoder and encoder agreeing on initial states is for each block. In other words, each parameter is initialized to a predetermined value, and then the encoding begins. Every time the encoder produces an output symbol, that symbol can be sent to the decoder immediately, because the decoder knows the parameter values used to encode it. After the encoder outputs a symbol, it then computes new values for the encoding parameters, depending on the symbol that was output, according to a predetermined adaptation rule. The decoder knows the parameter adaptation rule, and therefore it can also compute the new values for the encoding parameters. Thus, the encoding parameters are adjusted after every encoded symbol, and the encoder and decoder are always in sync, that is, the decoder tracks the changes in the encoding parameters. This means that the encoder does not need to send the decoder any overhead information in terms of what parameter values were used to encode the data.

Therefore, what is needed is a lossless Golomb/Rice (G/R) encoder and decoder (codec) and method that provides efficient compression and is capable of handling and encoding any input integer number that may appear. Moreover, what is also needed is an adaptive G/R codec and method that avoids the aforementioned problems with forward adaptation by using a backward-adaptive technique to provide fast tracking and efficient compression of the input data.

SUMMARY OF THE INVENTION

The invention disclosed herein includes an adaptive Golomb/Rice (G/R) encoder and decoder (codec) and method for lossless encoding and decoding of integer data. The adaptive G/R codec and method uses a novel backward-adaptive technique having novel adaptation rules. Using backward adaptation, the adaptive G/R codec and method quickly learns any changes in the statistics of the input data. In addition, the adaptive G/R codec and method is capable of encoding any input integer value.

The adaptive G/R codec and method also uses novel adaptation rules that adjust the encoding parameter after each encoded symbol. No probability tables or codeword tables are necessary, so the adaptive G/R codec and method can fit within a small memory footprint. The adaptive G/R codec and method thus is well-suited for modern processors, where memory access usually takes many more cycles than instruction fetching and execution. It is also well-suited for small devices with limited memory and limited processing power, because the adaptive G/R codec and method does not need to buffer the input data in blocks, and does not need to process each data value twice.

One of the main advantages of the adaptive G/R and method is that the G/R parameter (k) is adjusted and updated after every codeword that is generated. This allows any changes in the statistics of the input data be tracked very quickly. No overhead is necessary to transmit the G/R parameter to the decoder, because their changes are tracked by the decoder. Because the adaptation rules are simple, the computational complexity of using backward adaptation is low. Thus, the adaptive G/R codec and method is attractive for many practical applications.

The adaptive G/R method includes using encoding and adaptation rules. The encoding rules dictate that the next input value x is encoded by first mapping it to a nonnegative value u via a simple 1-1-mapping rule ($u=2x$ if $x>0$, and $u=-2x-1$, if $x<0$ ), and then encoding u using a Golomb/Rice encoder with parameter k, so the output codeword is denoted as GR(u,k).

After a symbol is encoded, then adaptation rules are applied. The adaptive G/R method uses simple but novel adaptation rules. The adaptation rules for k are as follows. From the input value u (recall that the G/R coder always operates on u values), a temporary value p is computed by $p=u>>k$ (where $>>$ denotes a right-shift operator). If $p=0$, then a scaled version of k, namely K, is decreased by a fifth integer constant, B3. If $p=1$, then k is left unchanged. If $p>1$, then K is increased by p. In this manner, the parameter k is updated for the G/R encoder in both the first and second modes, after each codeword is generated. The value of k to be used for generating the next codeword is then computed as k=K/L, where L is a fixed parameter (recall that division by L is just a shift operator if L is chosen as a power of two).

It can be seen from the description of the adaptation rules above that the adaptive G/R method also includes a feature called "fractional adaptation". Fractional adaptation allows for a finer control of the rate of adaptation. First, a scaling parameter, L, is defined, and the value of L is typically set to a power of two. Next, a scaled G/R parameter, K=k*L, is defined. When using the adaptation rules for k, the scaled parameter value K is incremented or decremented by integer constants, depending on the generated codeword. After adaptation of K, the final parameter value k is computed by k=K/L. In this way, the integer increment for K can be seen as fractional increments for k, which allow for smoother control of the value of k, thus with better tracking of changes in the input statistics. If k was adjusted by integer increments after every encoded symbol, its value would fluctuate too much. Such noise in parameter values would lead to a decrease in the compression ratio (the ratio in the number of bits needed to store the input data in straight binary format to the number of bits needed to store the encoded bitstream). In a tested embodiment, the scaling parameter equals sixteen and the value of the G/R parameter is based on a decay parameter of the digital data.

An adaptive G/R encoder includes modules and means for incorporating the adaptive G/R method described above.

The digital integer data includes integer vectors having values. The values are such that a most probable value for each value is zero, and nonzero values have probabilities that decrease as the nonzero values increase. The adaptive G/R method also includes a process for encoding and decoding data. The process includes encoding each value x of the digital integer data using adaptive Golomb/Rice (G/R) encoding and a G/R parameter k, and defining a fractional G/R parameter as K=k*L, where L is a scaling parameter. The process also includes using a backward-adaptive technique having adaptation rules to update the fractional G/R parameter K after each value x of the digital integer data is encoded, and appending the encoded values of the digital integer data into a bitstream. The process also includes decoding the bitstream using a G/R decoder to recover exactly each value x of the digital integer data.

An adaptive G/R decoder and method works by using decoding rules corresponding to the encoding rules above, and using the same adaptation rules described above. The decoding rule at the decoder reverses the previously described encoding rule at the encoder. Namely, the decoder reads as many bits from the input bitstream (or file) as necessary, depending on the current value of the GR parameter k. In this manner, the decoder reads a complete codeword corresponding to a valid Golomb/Rice code GR(u,k), according to Table 1. Since the Golomb/Rice code is uniquely decodable for every parameter k, the decoder then can decode that codeword. In other words, the decoder can determine the value of the symbol u that was present at the encoder. From u, the decoder can determine the corresponding data value x simply by using the inverse 1-1 mapping rule. In particular, if u is even, then x=u/2, and, if u is odd, then x=-(u+1)/2. The decoding process described above is performed to decode an input codeword into an output value or string of values that matches exactly what was seen at the encoder. Thus, the decoding process is lossless.

After decoding a codeword from the input bitstream or file as described above, the decoder then computes the same adaptation rules as described for the encoder above. In this manner, the decoder will adjust the values of the parameter k in exactly the same way as the encoder does. Thus, the parameter will have the correct value for decoding the next bitstream (or file) codeword.

BRIEF DESCRIPTION OF THE DRAWINGS

The present invention can be further understood by reference to the following description and attached drawings that illustrate aspects of the invention. Other features and advantages will be apparent from the following detailed description of the invention, taken in conjunction with the accompanying drawings, which illustrate, by way of example, the principles of the present invention.

Referring now to the drawings in which like reference numbers represent corresponding parts throughout.

DETAILED DESCRIPTION OF THE INVENTION

In the following description of the invention, reference is made to the accompanying drawings, which form a part thereof, and in which is shown by way of illustration a specific example whereby the invention may be practiced. It is to be understood that other embodiments may be utilized and structural changes may be made without departing from the scope of the present invention.

I. Introduction

The adaptive Golomb/Rice (G/R) codec and method disclosed herein can be used in a wide variety of compression applications. For example, the adaptive G/R codec and method may be used in database applications to encode indices. The indices typically are positive, integer numbers that have a probability distribution similar to FIG. 1 because small values for the indices are more likely than large values. Another example is using the adaptive G/R codec and method for encoding head position of hard disks. Until the hard disk is full, data is more likely to be at the beginning of the hard disk than at the end. Therefore, small head values are more likely than large head values, such that the input data has a probability distribution similar to FIG. 1.

The adaptive G/R codec and method disclosed herein is an improved technique for the lossless compression of integer data. Vectors containing integer values are mapped by the encoder into a bitstream, which later then can be reconstructed exactly by the decoder. Using backward-adaptation for improved performance, the adaptive G/R codec and method quickly learns and adapts to changes in the statistics of the input data.

The adaptive G/R codec and method uses a backward-adaptation strategy that adjusts the G/R parameter after each encoded symbol. Probability tables or codeword tables are unnecessary, which allows the adaptive G/R encoder and method to fit in a very small memory footprint. The adaptive G/R codec and method thus is particularly well-suited for modern processors, where memory access takes usually many more cycles than instruction fetching and execution.

One key advantage of the adaptive G/R codec and method over previous kinds of entropy coders is that its backward-adaptation strategy quickly learns changes in the statistics of the data. Thus, in practice the adaptive G/R codec and method has exhibited better performance than other kinds of encoders, such as Huffman coders, block-adaptive Golomb/Rice encoders or context-adaptive arithmetic encoders. Another advantage of using a backward-adaptation strategy for the encoding parameters is that probability estimators are not needed. Still another advantage of the adaptive G/R codec and method is that it performs adaptation after each encoded symbol, in a single pass over the data, thus producing better compression results and faster encoding than encoders that use blockwise or forward adaptation.

II. General Overview

Figure 2A:
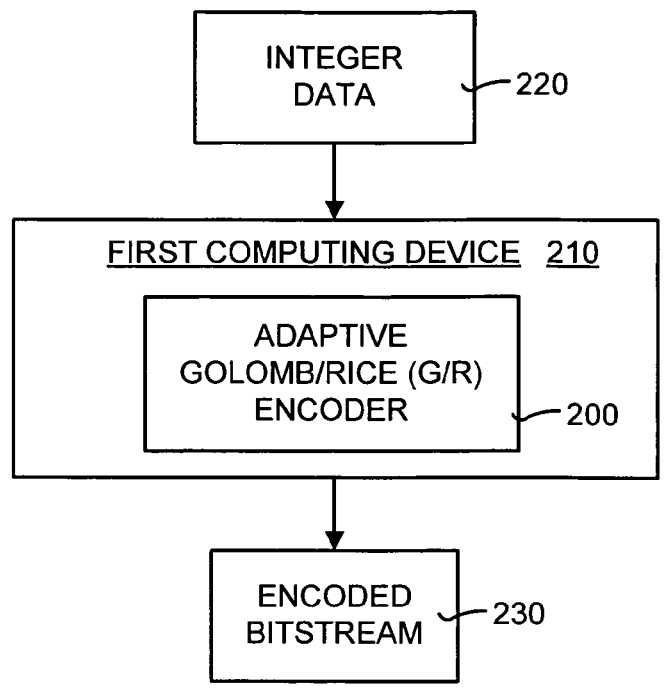
FIG. 2A is a block diagram illustrating an exemplary implementation of an encoder portion of the adaptive Golomb/Rice (G/R) codec and method disclosed herein.
Figure 2B:
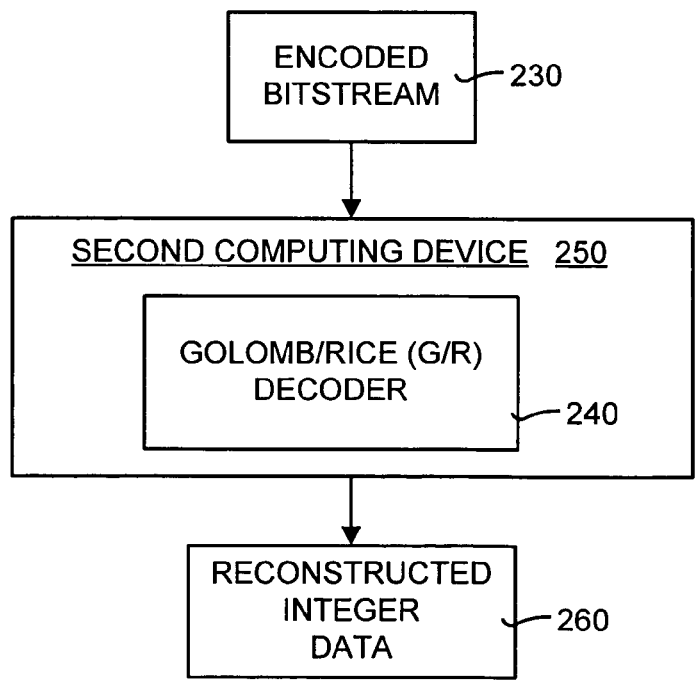
FIG. 2B is a block diagram illustrating an exemplary implementation of a decoder portion of the adaptive Golomb/Rice (G/R) codec and method disclosed herein.

FIGS. 2A & B are block diagrams illustrating an exemplary implementation of an adaptive Golomb/Rice (G/R) codec and method disclosed herein. In FIG. 2A, a block diagram for an encoder portion of the adaptive G/R codec and method is shown. In FIG. 2B, a block diagram for the decoder portion of the adaptive G/R codec and method is shown. It should be noted that FIGS. 2A & B are merely two of several ways in which the adaptive G/R codec and method may implemented and used.

Referring to FIG. 2A, the adaptive G/R encoder 200 runs on a first computing device 210. The adaptive G/R encoder 200 inputs and processes integer data 220. In general, given the integer data 220, such as a vector containing integer values, the adaptive G/R encoder 200 encodes or maps the integer data 220 into an encoded bitstream 230. The integer data 220 typically contains vectors of integers such that the most probable value is zero and any nonzero values have probabilities that decrease as the values increase. This type of integer data typically has a probability distribution function (PDF) similar to that shown in FIG. 1. After the integer data is encoded, the encoded bitstream 230 may be stored or transmitted.

Referring to FIG. 2B, a G/R decoder 240 resides on a second computing device 250. It should be noted that although shown as separate computing devices, the first computing device 210 and the second computing device 250 may be the same computing device. In other words, the G/R encoder 200 and decoder 240 may reside on the same computing device. In general, the G/R decoder 240 processes the encoder bitstream 230 and outputs a reconstructed integer data 260. Because the adaptive G/R encoder 200 performs lossless encoding of the integer data 220, the G/R decoder 240 can read the encoded bitstream 230 and reconstruct exactly the original data vector contained in the integer data 220.

It should be noted that in practical applications a device or equipment may incorporate a G/R encoder but not a G/R decoder (for example, a digital camera). Similarly, a device or equipment may incorporate a G/R decoder but not a G/R encoder (for example, a digital audio player or a digital picture viewer).

III. Exemplary Operating Environment

The adaptive Golomb/Rice (G/R) codec and method are designed to operate in a computing environment and on a computing device, such as the first computing device 210 and the second computing device 250 shown in FIG. 2. The computing environment in which the adaptive G/R codec and method operates will now be discussed. The following discussion is intended to provide a brief, general description of a suitable computing environment in which the adaptive G/R codec and method may be implemented.

Figure 3:
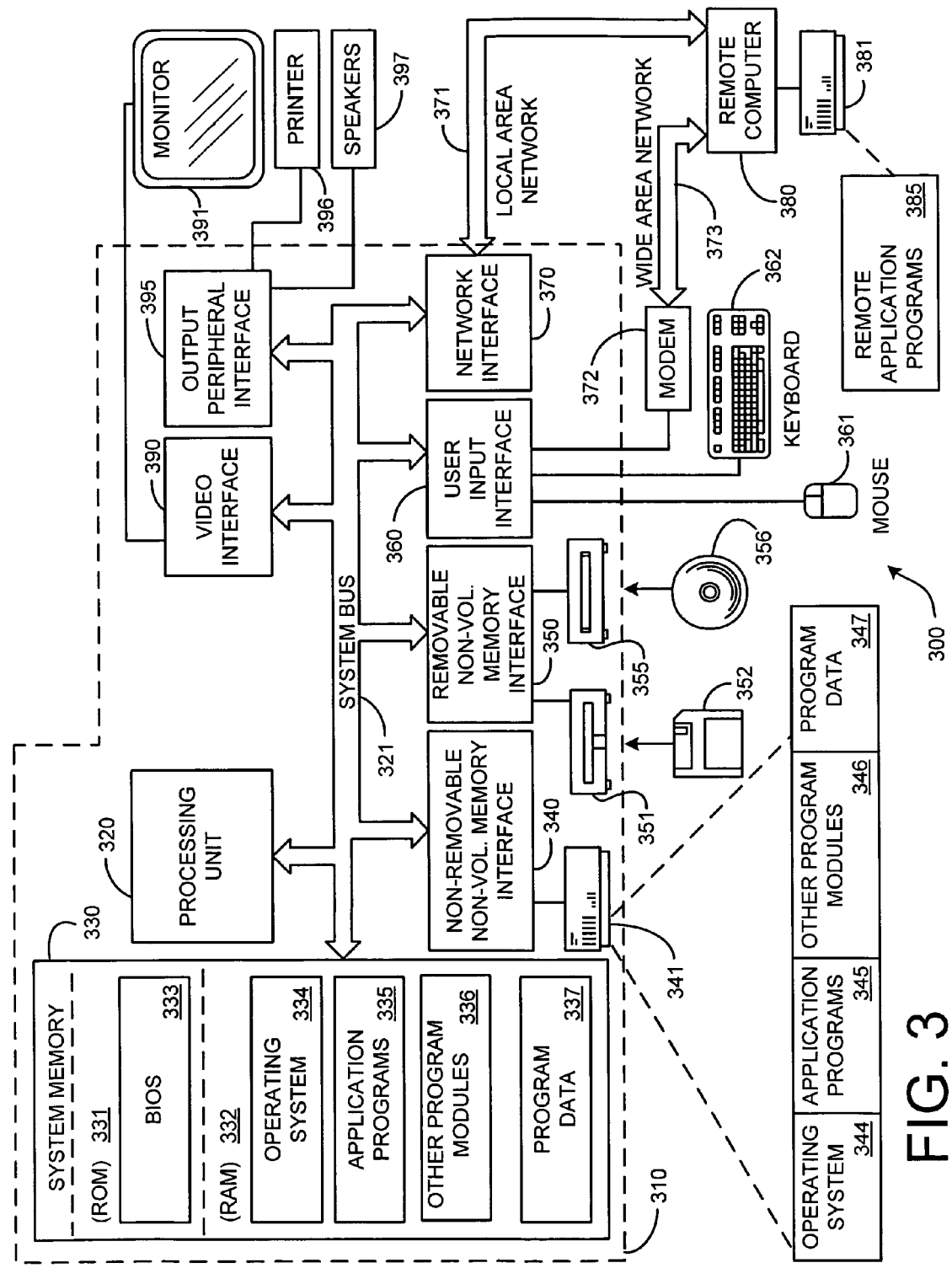
FIG. 3 illustrates an example of a suitable computing system environment in which the adaptive G/R codec and method shown in FIG. 2 may be implemented.

FIG. 3 illustrates an example of a suitable computing system environment in which the adaptive G/R codec and method shown in FIG. 2 may be implemented. The computing system environment 300 is only one example of a suitable computing environment and is not intended to suggest any limitation as to the scope of use or functionality of the invention. Neither should the computing environment 300 be interpreted as having any dependency or requirement relating to any one or combination of components illustrated in the exemplary operating environment 300.

The adaptive G/R codec and method is operational with numerous other general purpose or special purpose computing system environments or configurations. Examples of well known computing systems, environments, and/or configurations that may be suitable for use with the adaptive G/R codec and method include, but are not limited to, personal computers, server computers, hand-held, laptop or mobile computer or communications devices such as cell phones and PDA's, multiprocessor systems, microprocessor-based systems, set top boxes, programmable consumer electronics, network PCs, minicomputers, mainframe computers, distributed computing environments that include any of the above systems or devices, and the like.

The adaptive G/R codec and method may be described in the general context of computer-executable instructions, such as program modules, being executed by a computer. Generally, program modules include routines, programs, objects, components, data structures, etc., that perform particular tasks or implement particular abstract data types. The adaptive G/R codec and method may also be practiced in distributed computing environments where tasks are performed by remote processing devices that are linked through a communications network. In a distributed computing environment, program modules may be located in both local and remote computer storage media including memory storage devices. With reference to FIG. 3, an exemplary system for implementing the adaptive G/R codec and method includes a general-purpose computing device in the form of a computer 310. The computer 310 is an example of the first computing device 210 and the second computing device 250 shown in FIG. 2.

Components of the computer 310 may include, but are not limited to, a processing unit 320, a system memory 330, and a system bus 321 that couples various system components including the system memory to the processing unit 320. The system bus 321 may be any of several types of bus structures including a memory bus or memory controller, a peripheral bus, and a local bus using any of a variety of bus architectures.

By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 310 typically includes a variety of computer readable media. Computer readable media can be any available media that can be accessed by the computer 310 and includes both volatile and nonvolatile media, removable and non-removable media. By way of example, and not limitation, computer readable media may comprise computer storage media and communication media. Computer storage media includes volatile and nonvolatile removable and non-removable media implemented in any method or technology for storage of information such as computer readable instructions, data structures, program modules or other data.

Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computer 310. Communication media typically embodies computer readable instructions, data structures, program modules or other data in a modulated data signal such as a carrier wave or other transport mechanism and includes any information delivery media.

Note that the term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 330 includes computer storage media in the form of volatile and/or nonvolatile memory such as read only memory (ROM) 331 and random access memory (RAM) 332. A basic input/output system 333 (BIOS), containing the basic routines that help to transfer information between elements within the computer 310, such as during start-up, is typically stored in ROM 331. RAM 332 typically contains data and/or program modules that are immediately accessible to and/or presently being operated on by processing unit 320. By way of example, and not limitation, FIG. 3 illustrates operating system 334, application programs 335, other program modules 336, and program data 337.

The computer 310 may also include other removable/non-removable, volatile/nonvolatile computer storage media. By way of example only, FIG. 3 illustrates a hard disk drive 341 that reads from or writes to non-removable, nonvolatile magnetic media, a magnetic disk drive 351 that reads from or writes to a removable, nonvolatile magnetic disk 352, and an optical disk drive 355 that reads from or writes to a removable, nonvolatile optical disk 356 such as a CD ROM or other optical media.

Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 341 is typically connected to the system bus 321 through a non-removable memory interface such as interface 340, and magnetic disk drive 351 and optical disk drive 355 are typically connected to the system bus 321 by a removable memory interface, such as interface 350.

The drives and their associated computer storage media discussed above and illustrated in FIG. 3, provide storage of computer readable instructions, data structures, program modules and other data for the computer 310. In FIG. 3, for example, hard disk drive 341 is illustrated as storing operating system 344, application programs 345, other program modules 346, and program data 347. Note that these components can either be the same as or different from operating system 334, application programs 335, other program modules 336, and program data 337. Operating system 344, application programs 345, other program modules 346, and program data 347 are given different numbers here to illustrate that, at a minimum, they are different copies. A user may enter commands and information into the computer 310 through input devices such as a keyboard 362 and pointing device 361, commonly referred to as a mouse, trackball or touch pad.

Other input devices (not shown) may include a microphone, joystick, game pad, satellite dish, scanner, radio receiver, or a television or broadcast video receiver, or the like. These and other input devices are often connected to the processing unit 320 through a user input interface 360 that is coupled to the system bus 321, but may be connected by other interface and bus structures, such as, for example, a parallel port, game port or a universal serial bus (USB). A monitor 391 or other type of display device is also connected to the system bus 321 via an interface, such as a video interface 390. In addition to the monitor, computers may also include other peripheral output devices such as speakers 397 and printer 396, which may be connected through an output peripheral interface 395.

The computer 310 may operate in a networked environment using logical connections to one or more remote computers, such as a remote computer 380. The remote computer 380 may be a personal computer, a server, a router, a network PC, a peer device or other common network node, and typically includes many or all of the elements described above relative to the computer 310, although only a memory storage device 381 has been illustrated in FIG. 3. The logical connections depicted in FIG. 3 include a local area network (LAN) 371 and a wide area network (WAN) 373, but may also include other networks. Such networking environments are commonplace in offices, enterprise-wide computer networks, intranets and the Internet.

When used in a LAN networking environment, the computer 310 is connected to the LAN 371 through a network interface or adapter 370. When used in a WAN networking environment, the computer 310 typically includes a modem 372 or other means for establishing communications over the WAN 373, such as the Internet. The modem 372, which may be internal or external, may be connected to the system bus 321 via the user input interface 360, or other appropriate mechanism. In a networked environment, program modules depicted relative to the computer 310, or portions thereof, may be stored in the remote memory storage device. By way of example, and not limitation, FIG. 3 illustrates remote application programs 385 as residing on memory device 381. It will be appreciated that the network connections shown are exemplary and other means of establishing a communications link between the computers may be used.

IV. System Components

Figure 4:
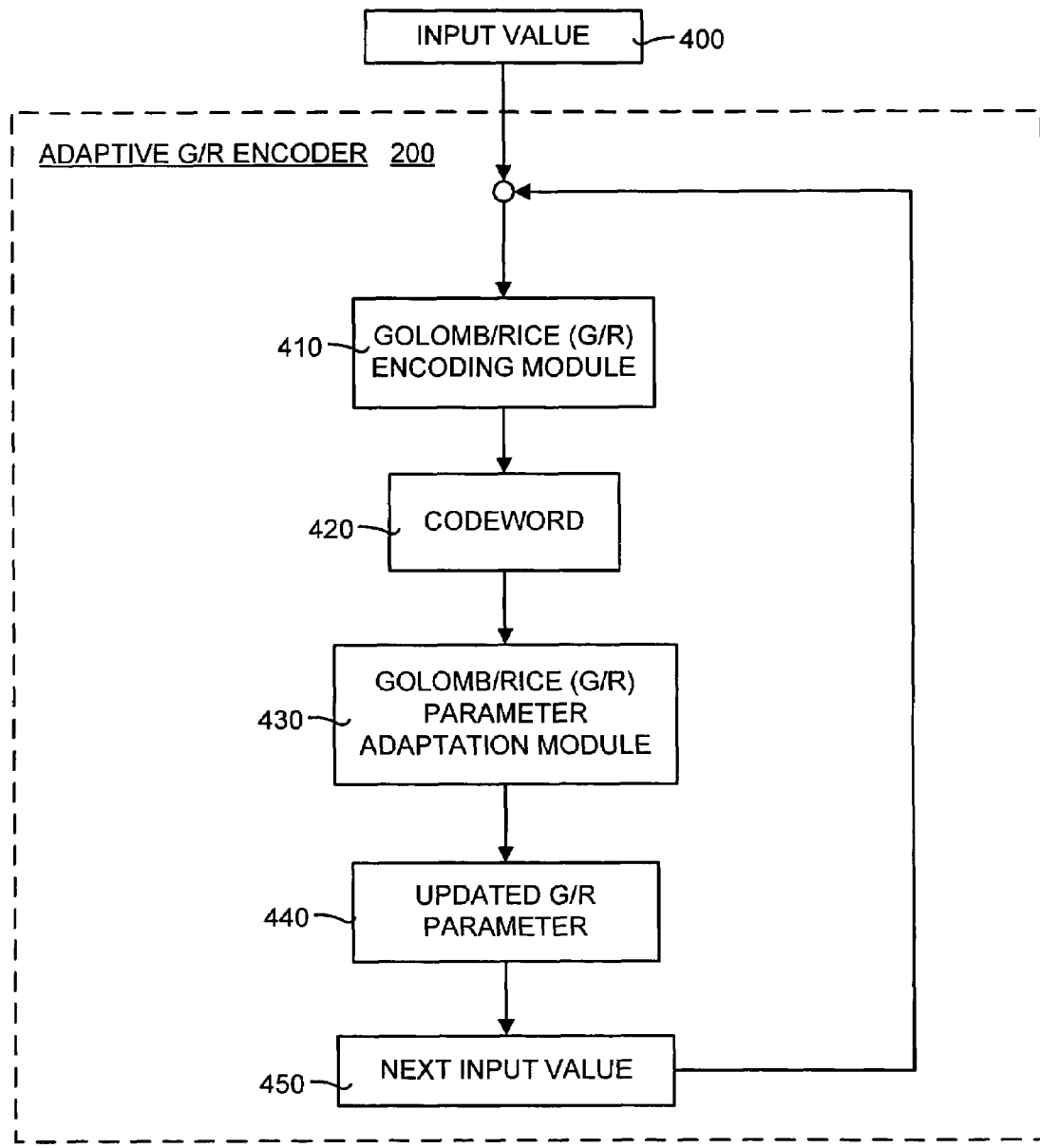
FIG. 4 is a general block diagram illustrating components of the adaptive G/R encoder shown in FIG. 2.

FIG. 4 is a general block diagram illustrating components of the adaptive G/R encoder 200 shown in FIG. 2. The adaptive G/R encoder receives as input an input value (or string of values) 400. The Golomb/Rice (G/R) encoding module 410 is used to encode the input value (or string) 400 to obtain a codeword 420. After the encoding of each input value (or string) 400, the encoding parameter is adapted to track the statistics of the input data.

A Golomb/Rice (G/R) parameter adaptation module 430 is used to update the original G/R parameter using a backward-adaptive technique and novel adaptation rules. This yields an updated G/R parameter 440. The adaptation of the G/R parameter will be discussed in detail below. Once the parameter has been updated, a next input value 450 is processed by the adaptive GR encoder 200 using the updated G/R parameter 440.

V. Operation Overview

Figure 5:
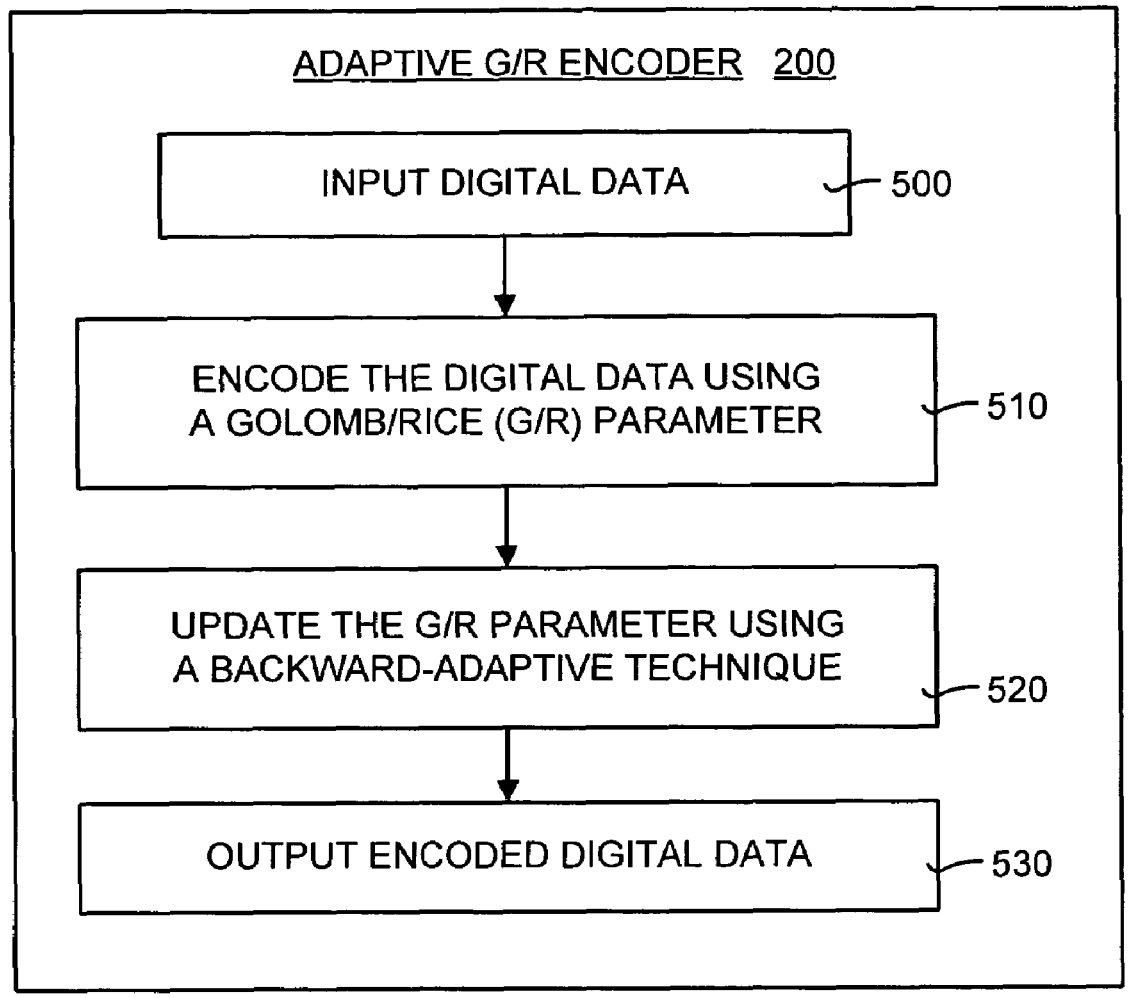
FIG. 5 is a general flow diagram illustrating the general operation of the adaptive G/R encoder and method shown in FIGS. 2 and 4.

The operation of the adaptive G/R encoder 200 and method used therein as shown in FIGS. 2 and 4 now will be discussed. FIG. 5 is a general flow diagram illustrating the general operation of the adaptive G/R encoder and method shown in FIGS. 2 and 4. The method begins by inputting digital data to be encoded (box 500). In one tested embodiment, the input digital data is integer data in the form of a vector having elements that are integer values. It should be noted that the each input digital data value can be any integer value, not restricted to a particular range (e.g. binary or binary-plus-sign, as it is common in other entropy coders). Next the digital data is encoded using a G/R parameter (box 510).

The digital data is encoded using a G/R parameter that has been initialized to a certain value. However, because the statistics of the input digital data may vary, the G/R encoder 200 is adaptive. This adaptation allows the adaptive G/R encoder 200 to track the statistics of the input digital data and adapt to those statistics quickly, to provide greater encoding efficiency. The adaptive G/R encoder 200 and method update the G/R parameter using a backward-adaptive technique (box 520). This updating of the G/R parameter occurs after each value or string of values of the input digital data is encoded. Moreover, the backward-adaptive technique includes novel adaptation rules, which are discussed in detail below. The encoded digital data then is output (box 530). Next, the next value or string of the input digital data is processed using the method just described. The updated value of the G/R parameter is used in the encoding the next input value or string. This process is repeated until all the digital data has been encoded into an encoded bitstream.

Figure 6:
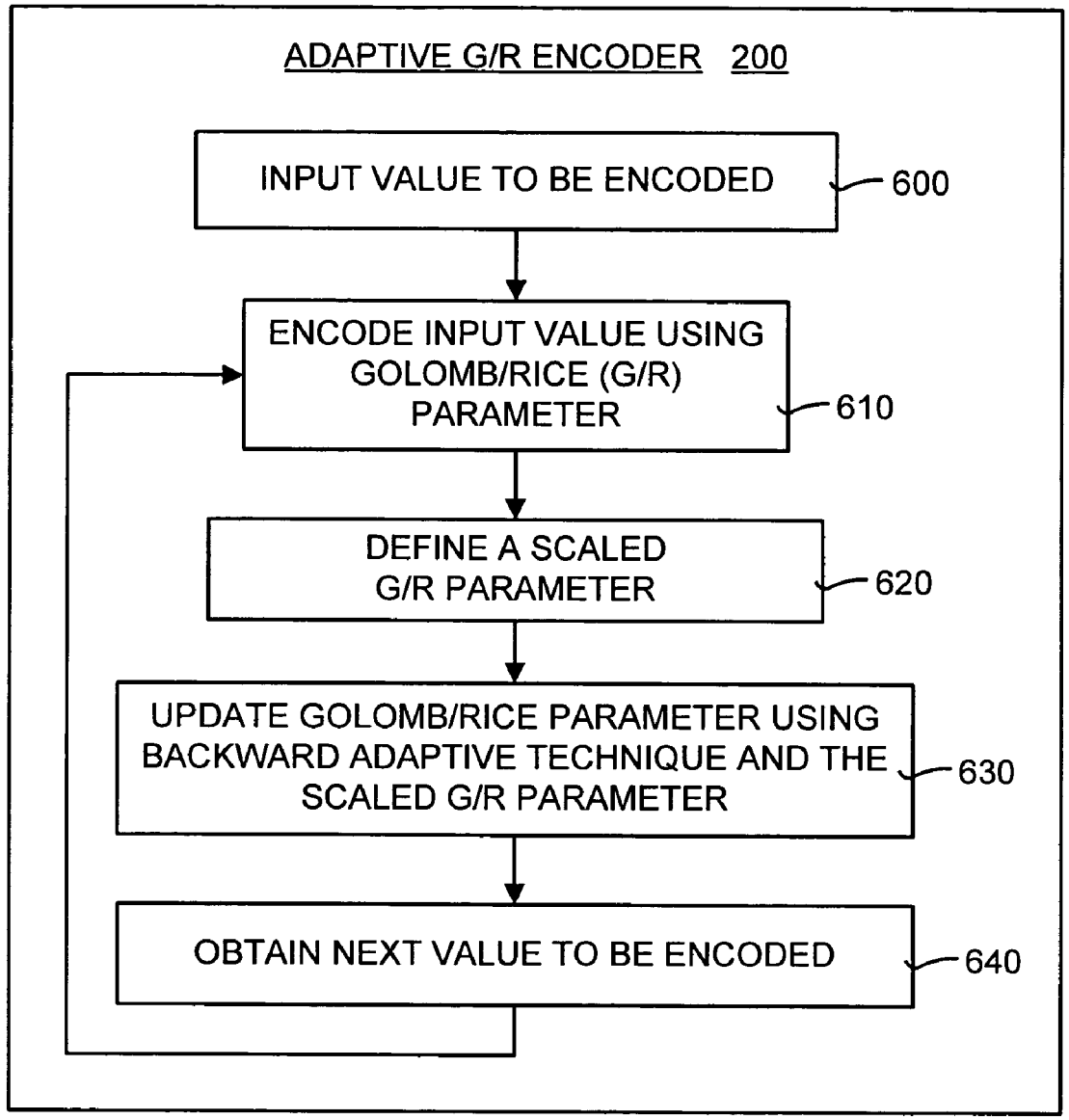
FIG. 6 is a flow diagram illustrating further details of the adaptive G/R encoder and method shown in FIG. 5.

FIG. 6 is a flow diagram illustrating further details of the adaptive G/R encoder and method shown in FIG. 5. Specifically, a value or string of the digital data is received as input (box 600). Next, the input value or string is encoded using a G/R parameter (box 610). After the input value or string has been encoded, the G/R parameter is updated. This adaptation process begins by defining a scaled G/R parameter (box 620). The scaled G/R parameter is used to slow down the adaptation of the G/R parameter such that the optimal parameter values can be more closely tracked. The scaled G/R parameter is discussed in more detail below. Next, the scaled G/R parameter is updated using a backward-adaptive technique and novel adaptation rules (box 630). The encoded input value or string is appended to the encoded bitstream and the next value or string from the digital data to be encoded is input (box 640). The process begins again to encode the next value or string using the updated scaled G/R parameter.

VI. Operation Details

The operational details of the adaptive G/R encoder 200 and method of FIGS. 4, 5 and 6 discussed above will now be discussed.

Golomb/Rice (G/R) Parameter Adaptation Module

Figure 7:
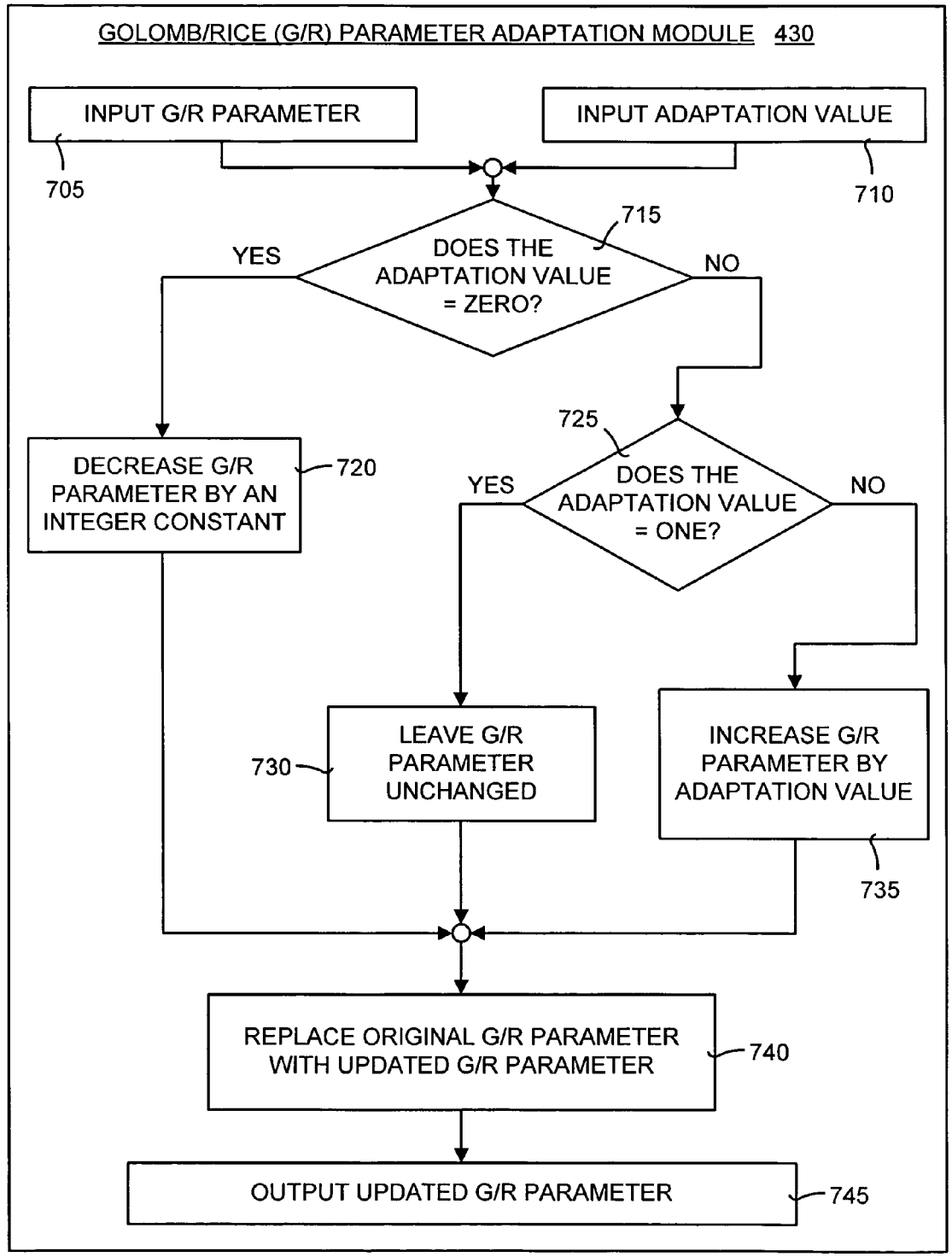
FIG. 7 is a detailed flow diagram of the operation of the Golomb/Rice (G/R) parameter adaptation module of the adaptive G/R codec and method shown in FIG. 4

FIG. 7 is a detailed flow diagram of the operation of the Golomb/Rice (G/R) parameter adaptation module 430 of the adaptive G/R encoder 200 and method shown in FIG. 4. In general, the G/R parameter adaptation module 430 updates an initial G/R parameter using a backward-adaptive technique having novel adaptation rules. The update is performed after each value or string of the digital data is encoded.

The operation begins by receiving as input the initial G/R parameter (box 705) and an adaptation value (box 710), whose computation will be described later. A determination then is made as to whether the adaptation value equals zero (box 715). If so, then the adaptation rules are to decrease the scaled G/R parameter by an integer constant (box 720).

If the adaptation value does not equal zero, a determination is made whether the adaptation value is equal to one (box 725). If so, then the adaptation rules leave the scaled G/R parameter unchanged (box 730). If not, then the adaptation rules are to increase the scaled G/R parameter by the adaptation value (box 735).

Once the G/R parameter has been adapted, the current G/R parameter is replaced with the updated G/R parameter (box 740). This is obtained by dividing the scaled G/R mode parameter by a fixed scaling factor and keeping the integer part of the result. Since the adaptation adjusts the scaled G/R mode parameter by integer steps, the actual G/R parameter behaves as if it were adapted by fractional steps. Again, this is an example of "fractional adaptation", which permits finer control of the speed of adaptation. Of course, if the G/R parameter is left unchanged (box 730) then there is no updating to perform, and the current G/R parameter is the same. Finally, the updated G/R parameter is output (box 745).

Figure 8:
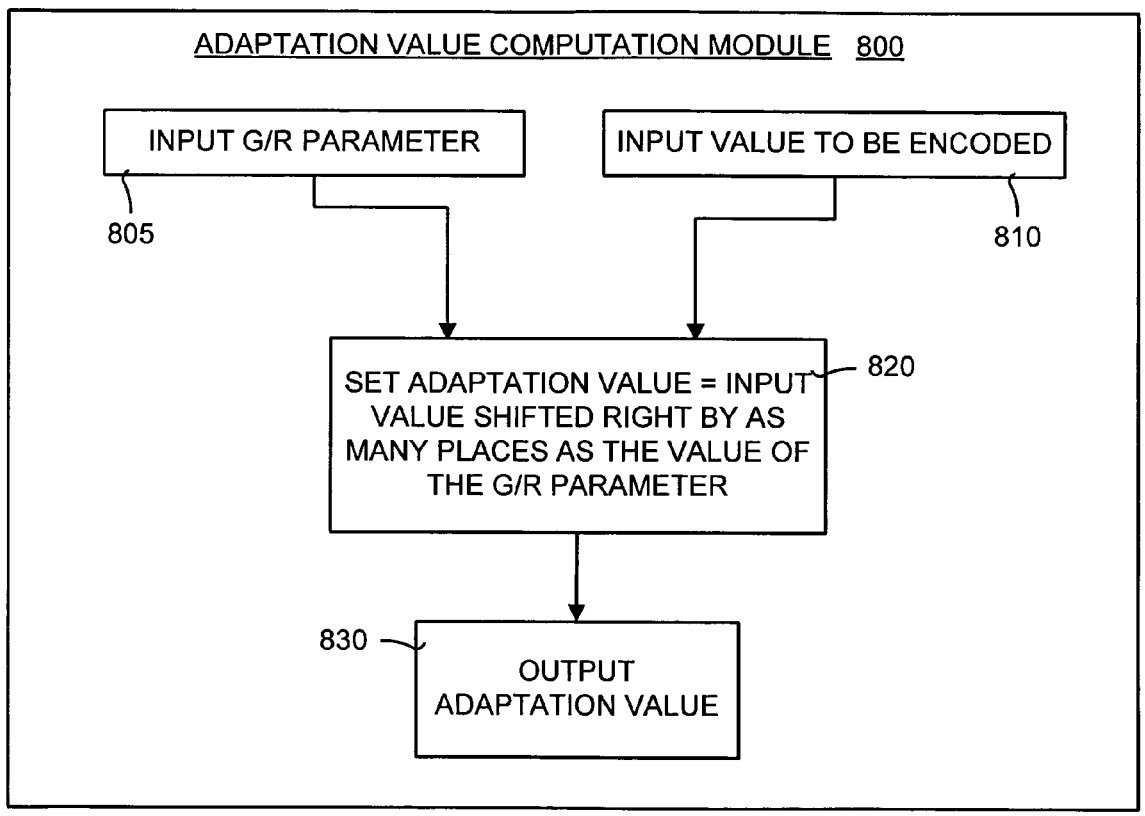
FIG. 8 is a detailed flow diagram of the computation of the adaptation value used by the Golomb/Rice (G/R) parameter adaptation module shown in FIG. 7.
Figure 9:
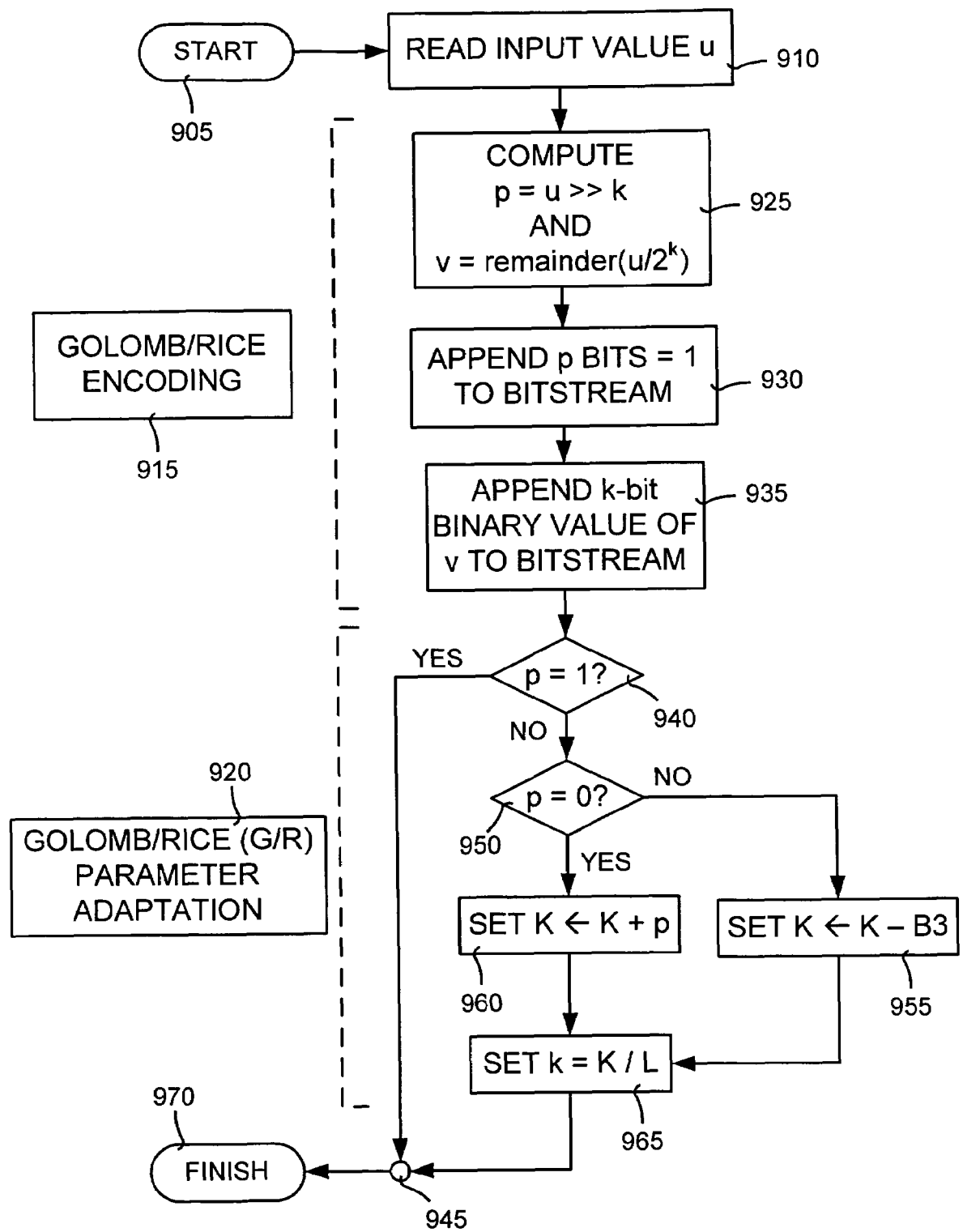
FIG. 9 is a working example illustrating the encoding details of the adaptive G/R encoder shown in FIGS. 2 and 4, including the G/R parameter k adaptation rules.

FIG. 8 is a detailed flow diagram of the computation of the adaptation value used by the Golomb/Rice (G/R) parameter adaptation module 430 shown in FIG. 7. Referring also to FIGS. 7 and 9, the adaptation value computation module 800 produces the adaptation value (box 710) that is an input to the flow diagram in FIG. 7. The operation begins by receiving two inputs, the current G/R parameter value (box 805) and the input value (box 810). Next, the input value is shifted to the right by as many places as the value of the G/R parameter (box 820). The resulting value is the adaptation value, which then is output (box 830).

VII. Working Example

In order to more fully understand the adaptive G/R encoder and method disclosed herein, the operational details of an exemplary working example are presented. It should be noted that this working example is only one way in which the adaptive G/R encoder and method may be implemented.

The adaptive Golomb/Rice (G/R) codec and method is an extension of the PTC entropy encoder disclosed in U.S. Pat. No. 6,477,280 cited above. However, the PTC entropy encoder of U.S. Pat. No. 6,477,280 is used for encoding binary data (typically bit-planes of integer data). The adaptive G/R codec and method disclosed herein can encode integer data having any input value. In other words, the adaptive G/R codec and method disclosed herein can encode data of any alphabet.

Figure 1:
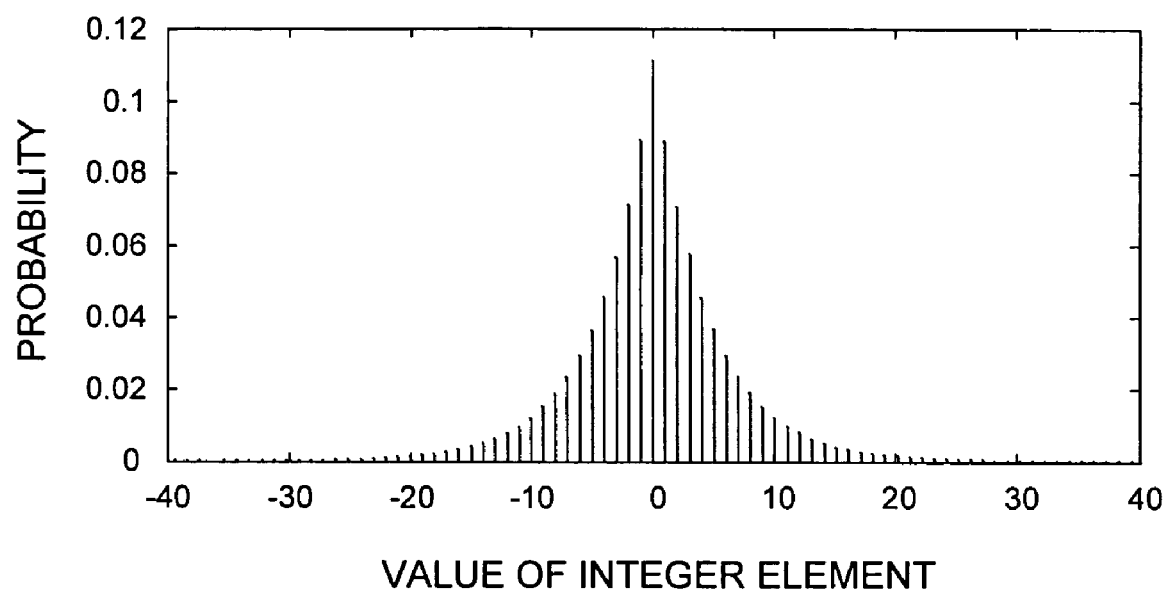
FIG. 1 illustrates a typical probability distribution for integer values that works well with the adaptive run-length Golomb/Rice (RLGR) encoder and method disclosed herein.

One advantage of the adaptive G/R encoder and method disclosed herein is that, unlike the PTC entropy encoder, there is no need to know the largest possible number of the input data. Instead, the adaptive G/R encoder and method can handle any size input value, no matter how large. This means that the adaptive G/R encoder assumes that the input data has a Laplacian distribution as shown in FIG. 1, and suddenly a large number appears in the input data, the adaptive G/R encoder and method is able to encode that large number.

While more bits will be used to encode that large number than a smaller number, the large number will be encoded. However, the penalty using more bits will only be paid for that large number when it occurs, and not for every other value. This is due to the new mode selection and adaptation rules set forth below.

With the PTC entropy encoder the input data is received, broken into bit planes, and then each bit plane is encoded with a G/R encoder. In the adaptive G/R codec and method disclosed herein, the adaptive G/R codec and method is extended to the handle Laplacian data directly. This has the advantage that the adaptive G/R codec and method uses single-pass encoding, which makes is significantly faster than the PTC entropy encoder.

The input data of the PTC entropy encoder had a Laplacian distribution, where small numbers are more likely. Sometimes small numbers are so much more likely that encoding runs of zeros is more efficient for a particular part of the bitstream. However, the PTC entropy encoder would pick up the data, do one pass on the most significant bit plane, and go back and do one pass in the next bit plane. For example, if the data was 16 bits, a pass was first done on bit #16 and encoded. Of course, most of the data will be zero, because that bit only gets split for very large numbers, then keeps going down. As bits #5, 4, 3, 2, and 1 are reached these bits have lots of zeros and ones, which means that it gets to a point that encoding them does not help at all. Usually the least significant bit is so random that a bit is used to encode the bit, that is, each input bit is directly copied to the output. The problem with the PTC entropy encoder is that encoding in bit planes requires several passes at the data. In particular, the PTC entropy encoder has to encode the most significant bit, the next bit, then the next bit, and so on. Clearly, this will take significantly more time, and in some cases the PTC entropy encoder is 1.5 to 3 times slower than the adaptive G/R encoder and method disclosed herein.

Encoding Rules

The adaptive G/R codec and method uses novel encoding rules that are based on the G/R parameter, k. Table 2 sets forth the coding rules for the adaptive G/R codec and method for mapping integer values x to a binary bitstream.

TABLE 2

| Adaptive Golomb/Rice | $x \geq 0: u = 2 |x|$ $x < 0: u = 2 |x| - 1$ | code = GR(u, k) |
|---|---|---|

In this working example, a mapping value, u, is defined. The input values, x, of the adaptive G/R codec and method can be positive or negative. The input value x is mapped to a u value, where u is only positive. Thus, the signed input value, x, is converted into an unsigned equivalent representation, u. Equation 4 sets forth the mapping from x to u. In particular, the mapping says that 0 maps to 0, 1 maps to 1, −1 maps to 2, 2 maps to 3, −2 maps to 4, and so forth, such that the u value is always positive. This is done so the G/R table (Table 1) can be used, because the G/R table is only for nonnegative values. This mapping allows the adaptive G/R codec and method to handle any input alphabet. In other words, because the G/R table is used (which can handle any input number), the input alphabet can be infinite and the adaptive G/R codec and method can handle any size number input. The adaptive G/R codec and method is only limited by the size of the numbers that the operating system can handle. It should be noted that in practice the G/R encoding Table 1 does not need to be stored in memory. It is easy to see that the table entries have enough structure that the codewords can be easily computed for any value of u and the encoding parameter k.

Given the u data, Table 2 states that the mapping value u of the input value x is encoded using an adaptive G/R encoder and the G/R encoding rule exemplified by Table 1. Thus, the codeword used to encode x is based on the values of u and k. The G/R parameter k is updated using a backward-adaptive technique and novel adaptation rules, as discussed in detail below. The rules in Table 2 precisely define how the encoder encodes, which means that the decoder can use the same rules in Table 2 to recover (or decode) the encoded data.

Fractional Adaptation

Fractional adaptation uses the scaled G/R parameter K instead of the G/R parameter k. Fractional adaptation is a way to slow down adaptation. It is possible to use the adaptive G/R codec and method without fractional adaptation. However, without fractional adaptation the adaptation usually changes too quickly and typically fails to track the optimal parameters for the input data correctly.

In this working example, the adaptation of the k parameter is performed using the scaled K parameter. Thus, K is updated instead of k. The relationship between k and K is as follows: k=K/L, where L is a scaling parameter as explained above. Thus, when the adaptation is performed, the value of K is adapted and K is divided by L to obtain the value of k. Note that all values are integers, so by k=K/L it is meant the integer part of the result. Also recall that the fixed scaling parameter L is set to a value equal to a power of 2 (e.g. L=16), then division by L can be efficiently performed by shift operators.

Fractional adaptation is preferred because the adaptive G/R codec and method makes an adjustment of the G/R parameter k for every code that is generated. In other words, after a input value or string is encoded the adaptation rules are performed. If k is adapted directly via integer-valued changes, then because they are integer numbers, all that can be done is stay the same or increase or decrease by at least 1. However, suppose the input data is getting bigger, meaning that the parameters should be increased.

Fractional adaptation allows a fractional increment of k. For example, k could be increased by 0.5 instead of 1. However, this is not allowed, because k is an integer parameter. So fractional adaptation performs an integer increment in K, and divides K by L to give an fractional increment of k. This ensures that there is no oscillation in the parameter k.

Instead of using fractional adaptation it is possible to define a flag such that if there is a decrease or increase in the data then a certain number of encoding cycles passes before increasing or decreasing the parameters. A new parameter could be defined that keeps track of the number of encoding cycles. In other words, the parameter would keep track of how many times that the condition (input data increasing or decreasing) should happen before the parameters are changed. It should be noted, however, that this technique was tried, and the fractional adaptation provided superior results.

Golomb/Rice (k) Parameter Adaptation

The G/R parameter k is adapted after each input value or string is encoded. When fractional adaptation is used, the scaled G/R parameter K is actually adapted, instead of k directly. Table 3 sets forth the adaptation rules for the G/R parameter k. After encoding a value u, the adaptation is controlled by the adaptation value of p=u>>k, meaning that u is shifted to the right k places. After adaptation, the value of k is set to k=K/L, where L is a constant. In this working example, L=16.

TABLE 3

| | |
|---|---|
| p = 0 | decrease K by setting K ← K − B3 |
| p = 1 | no change |
| p > 1 | increase K by setting K ← K + p |

The G/R code from Table 1 depends on the parameter k. For example, if the value after an incomplete run is 13, the GR code for 13 is "1111111111110" (for k=0) and if k=1 it is "11111101". The larger k is, the smaller the number representing 13 will be. And the smaller k is, the larger the number representing 13 will be. Thus, the parameter k must be known. This means that the adaptive G/R codec and method can do a good job if it chooses a good value for k. However, it is not always advantageous to use large values of k because it will produce longer strings for smaller values of the input data, as shown in Table 1. In other words, a good choice for the value of k depends on the input data. If the value is 13, then using a large value of k is a good idea. However, suppose that the value after the incomplete run is "1". Then, a smaller value of k is desirable. Thus, for small values after the incomplete run, it is better to use a small k, and for large values it is better to use a large k. Thus, the choice of k is related to the probability of the values. In the prior art there is a body of theoretical work to this effect: that if the probability for the input data is known (for example, if the input data is Laplacian where there is a single parameter than controls the decay), there are well-known formulas that from that decay parameter the parameter k to be used can be computed. This gives on average the mapping to use as few bits as possible.

Thus, it is important for the k parameter to be adaptive. That way, if on the input data there are big values coming up, k should be increased, because for big values larger k is better. On the other hand, if there are smaller values coming up, k should be decreased. Instinctively, it can be seen that for big numbers k should be increased and for small numbers k should be decreased. Then as long as k is changed at a small enough pace (such as when using fractional adaptation), the optimal parameters for the input data will always be tracked correctly.

The adaptation rules for k shown in Table 3 are significantly new. In the adaptive G/R codec and method, any value can come up, so this value must be encoded. The encoding is done using the adaptive G/R encoder and the G/R parameter k. Referring to Table 3, the input data is x. The input data x can be any integer number, small x's are more likely (can be positive or can be negative). However, G/R encoding is only for positive numbers. A straightforward mapping of x is used (see equation 4) to map x into u. The adaptation of k is controlled by the adaptation value p, which is defined as u shifted to the right k places. Thus, the adaptation value p is a scaled down version of u. Or, equivalently, the p parameter is an integer approximation to $u/2^k$. Shifting k places to the right is equivalent to dividing the number by $2^k$. For example, if a number is shifted 5 bits to the right this is the same as dividing the number by 32 (or $2^5$). The remainder is thrown away, and just the quotient is used.

Referring to Table 3, if the adaptation value p is equal to zero, then K is updated and replaced by K decreased by an integer constant, B3. If the adaptation value p is equal to one, then K is unchanged. If the adaptation parameter p is greater than one, then K is updated and replaced by K decreased by the adaptation value p.

If the adaptation value of p is equal to one, it means that the value of u was close to $2^k$, and those are the kinds of values for which the parameter k is correct. Thus, as shown in Table 3, there is no change. If the value of the adaptation value p is 0, which means that the input value was smaller than $2^k$. This means it is time to start decreasing k (because the input values are smaller than $2^k$). The case where the adaptation value p is greater than 1 is much less likely because the input values are not likely to be very big. But if the numbers are big and p>1, then it is time to start increasing the k parameter.

Adaptive G/R Encoder

FIG. 9 is a working example illustrating the encoding details of the adaptive G/R encoder 200, shown in FIGS. 2 and 4, including the G/R parameter k adaptation rules. The process begins (box 905) by reading the input value u (box 910). The two main processes of the adaptive G/R encoder 200 are G/R Encoding (box 915) and G/R Parameter Adaptation (box 920).

The G/R Encoding 915 process begins by computing an adaptation value p and v (box 925). The bitstream is appended with p bits equal to one (box 930). The k-bit binary value of v then is appended to the bitstream (box 935). These operations comprise the adaptive Golomb/Rice encoder as defined in Table 1.

The G/R Parameter Adaptation 920 process includes determining whether the adaptation value p is equal to one (box 940). If so, then the adaptation value p is left unchanged (point 945). Otherwise, another determination is made whether the adaptation value p equals zero (box 950). If not, then K is updated and replaced by K decreased by the integer constant, B3 (box 955). Otherwise, K is updated and replaced by K increased by the adaptation value p (box 960). Finally, the process sets k equal to K divided by L (box 965) and the process finishes (box 970).

Results

The adaptive G/R codec and method of this working example has been implemented in applications for image, audio, and map data compression. The results of using the adaptive G/R codec and method in these applications have been compression ratios that are comparable to the most sophisticated entropy coders, but in a simpler implementation.

In particular, with respect to existing entropy encoders for integer data, the adaptive G/R codec and method achieves compression rates near the theoretical maximum (dictated by the source entropy) for a large class of source symbol probability distributions, like the one in FIG. 1. By way of example, well-known Golomb-Rice and Huffman encoders are efficient only for source entropies of 1 bit per symbol or higher.

VIII. Decoding

The adaptive G/R codec and method also includes a decoder that can be precisely implemented based on the encoder description above. Referring to FIG. 2B, a computing device (box 250) can implement just the G/R decoder 240. The adaptive G/R decoder 240 and method receive codewords from an encoded bitstream (box 230). Next, the adaptive G/R decoder 240 decodes the codewords by applying the reverse rules set forth above for the adaptive G/R encoder 200. Next, the G/R parameter is adapted using exactly the same rules as those for the adaptive G/R encoder. Finally, the decoded (or reconstructed) integer data is output (box 260).

Since the encoding rules are uniquely decodable and the adaptation rules for the decoder are identical to those of the encoder, the previous descriptions of the encoding rule and adaptation rules also describe precisely the operations of the decoder.

The foregoing description of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description of the invention, but rather by the claims appended hereto.

What is claimed is:

1. A computer-implemented method for processing digital data, comprising:
   using a general-purpose computing device to perform the following method:
   encoding an input value of the digital data using a Golomb/Rice (G/R) parameter to generate a codeword for the input value;
   updating the G/R parameter using a backward-adaptive technique having adaptation rules after the codeword is generated;
   defining an adaptation value;
   decreasing the G/R parameter by an integer constant if the adaptation value equals zero;
   leaving the G/R parameter unchanged if the adaptation value equals one;
   repeating the encoding and updating for each value of the digital data to generate encoded data; and
   storing the encoded data such that the encoded data occupies less storage space than the digital data.

2. The method as set forth in claim 1, further comprising increasing the G/R parameter if the adaptation value is greater than one.

3. The method as set forth in claim 2, further comprising increasing the G/R parameter by the adaptation value if the adaptation value is greater than one.

4. The method as set forth in claim 1, further comprising:
   defining a scaling parameter; and
   defining a scaled G/R parameter as equal to the G/R parameter multiplied by the scaling parameter.

5. The method as set forth in claim 4, further comprising updating scaled G/R parameter instead of the G/R parameter by using a backward-adaptive technique having adaptation rules after the codeword is generated.

6. The method as set forth in claim 5, further comprising:
   setting the scaling parameter equal to sixteen; and
   determining the value of the G/R parameter based on a decay parameter of the digital data.

7. The method as set forth in claim 1, wherein the digital data further comprises integer vectors having values such that: (a) a most probable value for each value is zero; and (b) nonzero values have probabilities that decrease as the nonzero values increase.

8. A computer-readable storage medium having stored and encoded thereon computer-executable instructions that are executable by a general-purpose computing device for performing the method recited in claim 1.

9. A computer-readable storage medium having stored and encoded thereon computer-executable instructions for encoding digital integer data having integer values that are executable by a general-purpose computing device for performing a method comprising:
   encoding each of the integer values using adaptive Golomb/Rice (G/R) encoding and a G/R parameter k to generate a codeword for each of the integer values;
   defining a scaled G/R parameter K using the G/R parameter k;
   defining an adaptation value p;
   replacing K with (K −B3) if p =0, wherein B3 is an integer constant;
   defining a parameter u as 2x if x >0;
   defining u as −2x −1 if x <0;
   defining p =u>>k, meaning p equals u shifted to the right k places;
   updating the scaled G/R parameter K after each codeword is generated using backward adaptation rules to generate encoded data; and
   storing the encoded data such that the encoded data occupies less storage space than the digital integer data.

10. The computer-readable storage medium of claim 9, further comprising:
    defining a scaling parameter L; and
    defining the scaled G/R parameter K as K =k multiplied by L.

11. The computer-readable storage medium of claim 10, further comprising setting the scaling parameter equal to a value that is a power of two.

12. The computer-readable storage medium of claim 9, wherein the digital integer data further comprises a vector x containing N integers and wherein each element x(n) of the vector x, where n =0 to N−1, has a probability distribution such that a most probable value is zero and values farther away from zero have fast decreasing probabilities.

13. The computer-readable storage medium of claim 12, wherein the probability distribution is given by the equation:

$$P(x, \theta) = \frac{1-\theta}{1+\theta}\theta^{|x|}$$

and wherein a parameter θ controls a rate of decay in probability as the absolute value of x grows.

14. The computer-readable storage medium of claim 9, further comprising leaving K unchanged if p =1.

15. The computer-readable storage medium of claim 14, further comprising replacing K with (K+p) if p>1.

16. A computer-implemented process for encoding and decoding digital integer data, comprising:
    using a general-purpose computing device to perform the following process actions:
    encoding each value x of the digital integer data using adaptive Golomb/Rice (G/R) encoding and a G/R parameter k;
    defining a scaled G/R parameter as K=k*L, wherein L is a scaling parameter;
    using a backward-adaptive technique having adaptation rules to update the scaled G/R parameter K after each value x of the digital integer data is encoded;
    replacing K with (K−B3) if p =0, wherein B3 is an integer constant;
    replacing x with a mapping parameter u =2x if x>0;
    replacing x with u =−2x−1 if x <0;
    defining an adaptation parameter p as ii shifted to the right k places, p=u>>k;
    appending the encoded values of the digital integer data into an encoded data bitstream;
    transmitting the encoded data bitstream over a transmission bandwidth such that the encoded data requires less transmission bandwidth than the digital integer data; and
    decoding the bitstream using a G/R decoder to recover exactly each value x of the digital integer data.

17. The computer-implemented process of claim 16, wherein the adaptation rules further comprise leaving K unchanged if p=1.

18. The computer-implemented process of claim 17, wherein the adaptation rules further comprise replacing K with (K+p) if p>1.

19. One or more computer-readable storage media having stored and encoded thereon computer-readable instructions thereon which, when executed by one or more processors, cause the one or more processors to implement the computer-implemented process of claim 16.

20. An adaptive Golomb/Rice (G/R) encoder for encoding digital integer data containing integer values, comprising:
 a general-purpose computing device;
 a storage means for storing encoded data such that the encoded data occupies less storage space than the digital integer data;
 a computer-readable storage medium having stored and encoded thereon a computer program having program modules containing computer-executable instructions that are executable by the general-purpose computing device, the computer program further comprising:
  a Golomb/Rice (G/R) encoder encoding module having a G/R parameter k for encoding the integer values; and
  an updating module for updating the G/R parameter k after each of the integer values is encoded using a backward adaptive technique having adaptation rules to generate encoded data; and
  wherein the adaptation rules further comprise updating the G/R parameter k as follows:
   defining an adaptation value, p;
   decreasing k by an integer constant if p=0;
   leaving k unchanged if p=1;
   increasing k by p if p>1.

21. The adaptive G/R encoder as set forth in claim 20, wherein the computer program further comprises a means for defining a scaled G/R parameter K, as follows:
 defining a scaling parameter, L;
 defining S=s*L; and
 defining K=k*L.

22. The adaptive G/R encoder as set forth in claim 21, wherein the computer program further comprises a means for updating K instead of k using the adaptation rules.

23. A computer-implemented method for decoding an encoded bitstream, comprising:
 using a general-purpose computing device to perform the following method:
  receiving a codeword from the encoded bitstream;
  decoding the codeword using a Golomb/Rice (G/R) parameter;
  updating the G/R parameter using a backward-adaptive technique having adaptation rules after the codeword is decoded;
  defining an adaptation value;
  decreasing the G/R parameter if the adaptation value equals zero;
  leaving the G/R parameter unchanged if the adaptation value equals one;
  increasing the G/R parameter if the adaptation value is greater than one;
  defining a scaling parameter;
  defining a scaled G/R parameter as equal to the G/R parameter multiplied by the scaling parameter;
  repeating the decoding and updating for each codeword of the encoded bitstream to recover a reconstructed digital data; and
  storing the reconstructed digital data.

24. The method as set forth in claim 23, further comprising decreasing the G/R parameter by an integer constant if the adaptation value equals zero.

25. The method as set forth in claim 23, further comprising increasing the G/R parameter by the adaptation value if the adaptation value is greater than one.

26. A computer-readable storage medium having stored and encoded thereon computer-executable instructions that are executable by a general-purpose computing device for performing the method recited in claim 23.

27. A computer-implemented process for decoding digital integer data that have been encoded into an encoded bitstream by an encoding process that encodes input value of the digital integer data using a Golomb/Rice (G/R) parameter to generate a codeword for the input value, updates the G/R parameter using a backward-adaptive technique having adaptation rules after the codeword is generated, and repeats the encoding and updating for each input value of the digital integer data, the process comprising:
 using a general-purpose computing device to perform the following process actions:
  receiving a series of codewords from the encoded bitstream;
  decoding each of the codewords using adaptive G/R decoding and a G/R parameter k;
  defining a scaled G/R parameter K using the G/R parameter k;
  defining an adaptation value p;
  replacing the scaled G/R parameter K with (K−B3) if p=0, wherein B3 is an integer constant;
  leaving the scaled G/R parameter K unchanged if p=1;
  updating the scaled G/R parameter K after each codeword is decoded using the backward-adaptive technique having adaptation rules to generate decoded digital integer data; and
  storing the decoded digital integer data.

28. The process of claim 27, further comprising replacing the scaled G/R parameter K with (K+p) if p>1.

* * * * *